United States Patent
Bruce et al.

(10) Patent No.: US 10,727,114 B2
(45) Date of Patent: Jul. 28, 2020

(54) INTERCONNECT STRUCTURE INCLUDING AIRGAPS AND SUBSTRACTIVELY ETCHED METAL LINES

(71) Applicant: International Business Machines Corporation, Armonk, NY (US)

(72) Inventors: Robert L. Bruce, White Plains, NY (US); Alfred Grill, White Plains, NY (US); Eric A. Joseph, White Plains, NY (US); Teddie P. Magbitang, San Jose, CA (US); Hiroyuki Miyazoe, White Plains, NY (US); Deborah A. Neumayer, Danbury, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 125 days.

(21) Appl. No.: 15/405,440

(22) Filed: Jan. 13, 2017

(65) Prior Publication Data
US 2018/0204759 A1 Jul. 19, 2018

(51) Int. Cl.
*H01L 23/52* (2006.01)
*H01L 21/768* (2006.01)
*H01L 23/532* (2006.01)

(52) U.S. Cl.
CPC .... *H01L 21/7682* (2013.01); *H01L 21/76852* (2013.01); *H01L 21/76885* (2013.01); *H01L 23/53238* (2013.01); *H01L 23/53295* (2013.01)

(58) Field of Classification Search
CPC .......... H01L 21/76807; H01L 45/1683; H01L 2221/1015; H01L 2221/1021; H01L 2221/1031; H01L 2221/1036; H01L 2224/05006; H01L 2224/05546; H01L 21/02063; H01L 21/486; H01L 21/76804; H01L 21/76805; H01L 21/76813;
(Continued)

(56) References Cited

U.S. PATENT DOCUMENTS 6,198,170 B1 * 3/2001 Zhao ................... H01L 24/03
                                                       257/781
6,841,844 B2 1/2005 Hsu et al.
(Continued)

FOREIGN PATENT DOCUMENTS

CN    103165519 B    7/2016
KR    20160002393 A  1/2016

*Primary Examiner* — Cuong B Nguyen
*Assistant Examiner* — Samuel Park
(74) *Attorney, Agent, or Firm* — Cantor Colburn LLP; Joseph Petrokaitis

(57) ABSTRACT

Integrated circuits including at least two electrically conductive interconnect lines and methods of manufacturing generally include a surface of the integrated circuit. At least two electrically conductive interconnect lines are separated by a space of less than 90 nm and are formed on the surface. Each of the at least two interconnect lines includes a metal cap, a copper conductor having an average grain size greater than a line width of the interconnect. A liner layer is provided, wherein the liner layer and the metal cap encapsulate the copper conductor. A dielectric layer overlaying the at least two electrically conductive interconnect lines and extending along sidewalls thereof is provided, wherein the dielectric layer is configured to provide an airgap between the at least two interconnect lines at the spacing.

12 Claims, 4 Drawing Sheets

(58) Field of Classification Search
CPC ......... H01L 21/76816; H01L 21/76831; H01L 21/76877; H01L 21/76879; H01L 21/76897; H01L 23/481; H01L 23/49827; H01L 23/5226; H01L 23/5384; H01L 29/4175; H01L 41/0474; H01L 2221/1057; H01L 2223/6616; H01L 2224/02373; H01L 2224/05009; H01L 2224/05025; H01L 2224/05085; H01L 2224/05087; H01L 2224/0509; H01L 2224/05093; H01L 2224/0557; H01L 2224/08146; H01L 2224/08; H01L 2224/13009; H01L 2224/13025; H01L 2224/16146; H01L 2224/16165; H01L 2224/16235; H01L 2224/29009; H01L 2224/29025; H01L 2224/32146; H01L 2224/32165; H01L 2224/8203; H01L 2225/06541; H01L 2225/06544; H01L 2225/06548; H01L 2225/107; H01L 2924/15172; H01L 2924/15182; H01L 2924/15192

See application file for complete search history.

(56) References Cited

U.S. PATENT DOCUMENTS

| | | |
|---|---|---|
| 7,091,611 B2 | 8/2006 | Ahn et al. |
| 7,842,600 B2 | 11/2010 | Yun et al. |
| 8,900,990 B2 | 12/2014 | Zhang et al. |
| 9,123,727 B2 | 9/2015 | Fischer |
| 9,171,796 B1 | 10/2015 | Brink et al. |
| 9,230,914 B2 | 1/2016 | Chen et al. |
| 9,263,391 B2 | 2/2016 | Nitta et al. |
| 9,281,211 B2 | 3/2016 | Yang et al. |
| 9,305,882 B2 | 4/2016 | Nitta et al. |
| 9,385,028 B2 | 7/2016 | Nemani et al. |
| 9,396,989 B2 | 7/2016 | Purayath et al. |
| 9,401,322 B2 | 7/2016 | Naujok et al. |
| 2009/0093112 A1* | 4/2009 | Al-Bayati ........... H01L 21/3105 438/618 |
| 2010/0270683 A1* | 10/2010 | Usami ................. H01L 21/7682 257/774 |
| 2012/0319279 A1* | 12/2012 | Isobayashi .......... H01L 23/4821 438/653 |
| 2015/0162278 A1* | 6/2015 | Zhang ............... H01L 21/76879 257/773 |
| 2015/0380272 A1* | 12/2015 | Wu ........................ C23C 16/54 438/653 |
| 2016/0027686 A1 | 1/2016 | Nitta et al. |
| 2016/0035621 A1 | 2/2016 | Chen et al. |
| 2016/0118292 A1* | 4/2016 | He ...................... H01L 21/7682 257/773 |
| 2016/0148867 A1 | 5/2016 | Yang et al. |
| 2016/0172231 A1* | 6/2016 | Lee ..................... H01L 21/7682 438/643 |
| 2016/0181144 A1 | 6/2016 | Nitta et al. |
| 2016/0197002 A1 | 7/2016 | Nitta et al. |

* cited by examiner

INTERCONNECT STRUCTURE INCLUDING AIRGAPS AND SUBTRACTIVELY ETCHED METAL LINES

BACKGROUND

The present invention relates to integrated circuits, and more specifically relates to interconnect structures including airgaps and subtractively etched metal lines.

Generally, semiconductor devices include a plurality of circuits that form an integrated circuit fabricated on a single substrate, such as a silicon crystal substrate. A complex network of signal paths will normally be routed to connect the circuit elements distributed on the surface of the substrate. Efficient routing of these signals across the device typically requires the formation of multi-level or multi-layered interconnection schemes such as, for example, dual damascene wiring structures based on copper. Copper based interconnects are desirable due to their efficacy in providing high speed signal transmission between large numbers of transistors on a complex semiconductor chip. Within the interconnection structure, metal vias run perpendicular to the substrate and metal lines run parallel to the substrate. Further enhancement of the speed of signals and reduction of interaction of signals in adjacent copper lines (known as "cross-talk") can be achieved in new IC product chips by surrounding the copper lines and vias in a low k or ultralow k dielectric, having a dielectric constant of about 1.5 to about 3.0. Still further speed enhancement can be achieved using an airgap structure because the dielectric constant of air is 1.0.

SUMMARY

Exemplary embodiments of the invention include integrated circuits having interconnect structures and methods of forming the same. In one or more embodiments, an integrated circuit includes a surface of the integrated circuit. At least two electrically conductive interconnect lines are separated by a space of less than 90 nm on the surface. Each of the at least two electrically conductive interconnect lines includes a metal cap, a copper conductor having an average grain size greater than a line width of the electrically conductive interconnect line, and a liner layer. The liner layer and the metal cap encapsulate the copper conductor. A dielectric layer overlays the at least two electrically conductive interconnect lines and extending along sidewalls thereof. The dielectric layer is configured to provide an airgap between the at least two interconnect lines at the spacing.

In one or more embodiments of the invention, at least two electrically conductive interconnect lines are separated by a spacing of less than 90 nm and are formed on a surface of an integrated circuit. Each of the at least two interconnect lines includes a ruthenium cap, a copper conductor having an average grain size greater than an interconnect line width, and a liner layer. The liner layer and the ruthenium cap encapsulate the copper conductor. A silicon containing dielectric layer overlays the at least two electrically conductive interconnect lines and extends along sidewalls thereof. The dielectric layer is configured to provide an airgap between the at least two electrically conductive interconnect lines at the spacing.

In one or more other embodiments of the invention, at least two electrically conductive interconnect lines are separated by a space of less than 90 nm, and at least two additional electrically conductive interconnect lines are separated by a space greater than 90 nm and are formed on a surface of an integrated circuit. Each of the at least two interconnect lines and the at least two additional interconnect lines include a ruthenium cap, a copper conductor having an average grain size greater than an interconnect linewidth, and a liner layer. The liner layer and the metal cap encapsulate the copper conductor. A silicon containing dielectric layer overlays the at least two interconnect lines and the at least two additional interconnect lines and extends along sidewalls thereof. The dielectric layer is configured to provide an airgap at the spacing of less than 90 nm and completely fill the spacing at spaces greater than 90 nm.

In one or more embodiments of the invention, a method for manufacturing an interconnect of an integrated circuit includes depositing a first liner layer onto a surface of an integrated circuit. A copper layer is deposited onto the first liner layer and annealed in an amount effective to increase grain size. A metal cap layer is deposited onto the copper layer. A hardmask is deposited onto the metal cap layer. The hardmask, the metal cap layer, the copper layer, and the first liner layer are patterned to form at least two electrically conductive interconnect lines. The at least two electrically conductive lines have a spacing therebetween of less than 90 nm. The copper has an average grain size greater than a line width of the interconnect lines. A second liner layer is deposited onto the at least two electrically interconnect lines. A dielectric layer is deposited overlaying the at least two electrically conductive interconnect lines and extending along sidewalls thereof. The deposition of the dielectric layer is configured to provide an airgap between the at least two electrically conductive interconnect lines.

In one or more other embodiments of the invention, a method for manufacturing interconnect lines in an integrated circuit includes depositing a first liner layer having at least one of tantalum, tantalum nitride, titanium, titanium nitride, cobalt or ruthenium onto a surface of an integrated circuit. A copper layer is deposited onto the first liner layer, wherein the copper layer is annealed in an amount effective to increase grain size. A metal cap layer is deposited onto the copper layer. A hardmask is deposited onto the metal cap layer, wherein the hardmask includes at least one of tantalum nitride or titanium nitride. The hardmask, the metal cap layer, the copper layer, and the first liner layer are patterned to form at least two interconnect lines having a spacing therebetween of less than 90 nm, and to further form at least two interconnect lines having a spacing therebetween greater than 90 nm. The copper has an average grain size greater than a line width of the interconnect lines. A second liner layer including at least one of tantalum, tantalum nitride, titanium, or titanium nitride, cobalt or ruthenium is deposited onto the interconnect lines. A dielectric layer is deposited overlaying the interconnect lines and extending along sidewalls thereof, wherein the dielectric layer is configured to provide an airgap at the spacing of less than 90 nm and fill the spacing greater than 90 nm.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
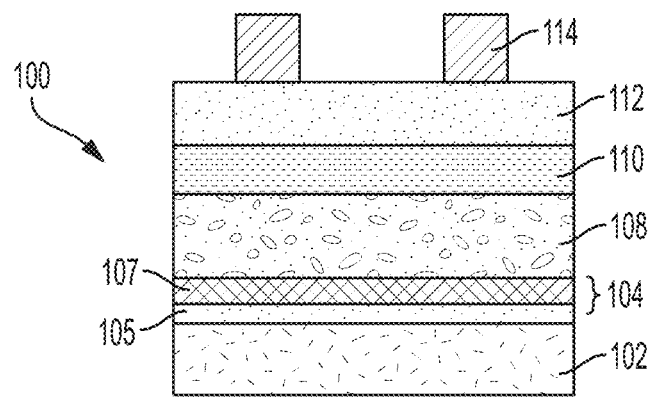
FIG. 1 depicts a cross sectional view of a portion of an exemplary integrated circuit including a copper conductive layer for formation of interconnects in accordance with one or more embodiments of the present invention.

Interconnect structures formed on an integrated circuit chip oftentimes include at least about 2 to about 10 wiring levels. In one class of structures, a low dielectric constant (k) material having a dielectric constant less than 3.0 is used. However, reliability problems are often associated with these structures.

As the feature sizes in complementary-metal-oxide-semiconductor (CMOS) technology continues to shrink, it becomes increasingly difficult to fabricate the metal interconnect structures using conventional processing techniques. For example, using a damascene process to fill trenches with copper often results in undesirable results including poor liner/seed coverage on the trench walls, pinch off at the trench mouth, and reentrant reactive ion etch profiles. In addition, the increasing ratio of the liner to copper thickness, decreasing copper grain size, and copper grain scattering phenomena result in increased copper resistivity, which make copper a less effective material as an interconnect material.

For example, a chip electrically conductive interconnect line made in a dielectric can fail or degrade due to poor liner barrier quality for the metal liner barrier between copper and the dielectric. This poor quality usually results from defects in the liner barrier, allowing copper or copper ions to penetrate the dielectric and allowing oxidizing species ($H_2O$, $O_2$, etc.) to interact with the copper (Cu). The defects and roughness are typically due to uneven coverage during the liner barrier deposition, for example, the presence of pores and roughness on the dielectric can result in small regions where the liner barrier is thin or discontinuous. Also, it can be difficult to deposit the liner barrier at the bottom of high aspect ratio vias, so the thin or discontinuous liner regions commonly are formed at the bottom of the vias, near the interface where the via meets the line below. Thus, there is a need to reduce or prevent defects in the liner barrier that are caused by open pores and extreme roughness on the surfaces of etched openings.

In addition, interconnect structures for high performance can use an air gap or air bridge to achieve the lowest dielectric constant. Reliability problems with these types of structures also usually involve Cu oxidation, because the metal liner barrier can be too thin to prevent Cu oxidation, or defects can form in the liner barrier during manufacturing due to particulates, lithography defects, or other sources. Also, dielectric breakdown in the air gap can occur.

Aspects of the present invention are generally directed to interconnect structures and methods of forming the same, wherein the interconnect structures include airgaps and subtractively etched copper lines. As will be described in greater detail below, the formation of airgaps is controlled by critical dimension space during dielectric deposition. Large spaces can be filled with the dielectric material to provide sufficient mechanical strength whereas small spaces are defined by an airgap to improve RC (resistor-capacitor) delay and reliability. Moreover, the subtractive etching of the copper layer to form the lines permits large grain growth, wherein the copper grains can be larger than the line width, which decreases copper resistivity. Advantageously, the improved interconnect structures and methods of forming the same prevent electromigration.

Detailed embodiments of the interconnect structures of the present invention are described herein. However, it is to be understood that the embodiments described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

To aid in understanding the present invention, FIGS. 1-6 illustrate a cross-section of a portion of an exemplary integrated circuit 100, e. g., a CMOS device, at various stages of an exemplary manufacturing process of the present invention. In particular, FIG. 1 illustrates the exemplary integrated circuit 100 at an intermediate stage in the processing. The exemplary integrated circuit 100 generally includes a plurality of layers deposited on a wafer (e.g., a silicon wafer) at this intermediate stage in the processing, including: a dielectric layer 102, a first liner layer 104 formed on the dielectric layer 102, a conductive copper metal layer 108 formed on the first liner layer 104, a barrier cap layer 110 formed on the conductive copper metal layer 108, a hard mask layer 112 formed on the barrier layer 110, and a patternable organic planarizing layer 114 formed on the hard mask layer 112. In one or more embodiments, the liner layer 104 is a bilayer as shown.

By way of example, the thickness of each of the plurality of layers is as follows: the liner layer can be a bilayer including a tantalum nitride underlayer and a tantalum overlayer having a total thickness of about 7 nanometers (nm) (e.g., tantalum nitride has a thickness of about 4 nm and tantalum has a thickness of about 3 nm), the conductive copper metal layer 108 has a thickness of approximately 40 nm, the barrier layer 110 has a thickness of approximately 10 nm, and the hardmask layer 208 has a thickness of approximately 50 nm.

The dielectric layer 102 can include any dielectric including inorganic dielectrics or organic dielectrics. Some examples of suitable dielectrics that can be used as the dielectric material include, but are not limited to: $SiO_2$, silsesquioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The dielectric can be deposited by PECVD procedures as is generally known in the art. In one or more embodiments, dielectric layer 102 is at a thickness within a range of 50 nm to 500 nm, although greater or lesser thicknesses can be used.

First liner layer 104 can be formed using conventional deposition processes, such as, for example, CVD, atomic layer deposition (ALD), physical vapor deposition (PVD), plasma enhanced chemical vapor deposition (PECVD), or the like. In one or more embodiments, the first liner layer 104 can be formed of a metal such as Ta, Ti, Ru, Jr, Co, and/or W, and/or a metal nitride thereof such as TaN, TiN, and WN. In one or more embodiments, the deposition of the first liner layer 104 can include a nitrogen gradient so as to form the corresponding nitride in an upper portion of the liner layer 104. For example, deposition of tantalum can be formed on the dielectric 102 to form tantalum layer 105 followed by introduction of a nitrogen source into the reactor to form tantalum nitride 107 on the tantalum portion. In one or more embodiments, the first liner layer 116 can range from 0.05 nm to 25 nm. In one or more other embodiments, the thickness of liner layer can range from 0.1 nm to 10 nm, and in still one or more other embodiments, the thickness of liner layer can range from 1 nm to 5 nm.

The conductive copper layer 108 can be deposited onto the surface of liner layer 104 by an electrochemical deposition process (also referred to as electroplating), e-beam evaporative deposition, physical vapor deposition, CVD, or the like. It should be noted that subsequent to copper deposition, the conductive copper layer 108 can be annealed at temperatures of about 200° C. to 500° C. in order to produce large grains. Notably, the anneal of the copper films has been demonstrated to produce larger grain size (e.g., as compared to no anneal). For example, the annealing step can produce average grain sizes of approximately 1 micrometer in diameter (the distance from grain boundary to grain boundary across the grain), average grain sizes greater than or equal to the linewidth, or greater than or one half of the linewidth of a resulting electrically conductive interconnect line. It is noted that in general, the larger the grain size, the greater reduction in grain boundary scattering. In addition, the smaller the size of the electrically conductive interconnect line, the greater percentage reduction in grain boundary scattering and resistivity/resistance (as compared to forming an interconnect structure of the same dimensions using damascene processing).

In one or more embodiments of the invention, the conductive copper layer 108 is subjected to a planarization process such as chemical mechanical planarization (CMP). The process can be timed if the structure does not include etch stops therein. As such, average grain sizes can be approximately equal to the thickness of the conductive copper layer 108. In one or more embodiments, the copper layer 108 can be at a thickness of 10 nm to 100 nm, although greater of less thickness can be used.

The barrier layer 110 can be formed of a metal such as tantalum, titanium, iridium, tungsten, tungsten nitride, nickel, platinum, ruthenium, cobalt, or the like. The barrier layer 110 prevents electromigration there through. In one or more embodiments, the barrier layer is formed of ruthenium. In one or more embodiments, the barrier layer is formed of cobalt or Ta or W or Ru. In one or more embodiments, the barrier layer 110 can be at a thickness of 1 nm to 20 nm, although greater of less thickness can be used.

The hard mask layer 112 can be formed using conventional deposition processes, such as, for example, CVD, atomic layer deposition (ALD), physical vapor deposition (PVD), plasma enhanced chemical vapor deposition (PECVD), etc. Hardmask layer 112 can include any material capable of functioning as an etch stop layer, such as, for example, titanium nitride, tantalum nitride, silicon nitride, and silicon oxynitride, or the like. In one or more embodiments, hardmask layer 112 includes a thickness ranging from about 5 nm to about 75 nm, although greater or lesser thicknesses can be used.

The organic planarizing layer 114 can be a polymer including carbon, hydrogen, oxygen, and optionally nitrogen, fluorine, and silicon. In one or more embodiments, the planarization layer 114 is a polymer with sufficiently low viscosity so that the top surface of the applied polymer forms a planar horizontal surface. The planarization layer, which can be a spin-deposited layer, can be baked at an elevated temperature to cure the planarization layer, if needed, and reflow its top surface into a substantially planar form. The thickness of the planarization layer is typically about 50 nanometers to about 500 nanometers (nm), although lesser and greater thicknesses can also be employed.

By way of example, the thickness of each of the plurality of layers is as follows: the liner layer can be a bilayer including a tantalum nitride underlayer and a tantalum overlayer having a total thickness of about 7 nanometers (nm) (e.g., the tantalum nitride layer has a thickness of about 4 nm and the tantalum layer has a thickness of about 3 nm), the conductive copper metal layer 108 has a thickness of approximately 40 nm, the barrier layer 110 has a thickness of approximately 10 nm, and the hardmask layer 208 has a thickness of approximately 50 nm.

FIG. 1 illustrates the integrated circuit 100 after a pattern of very small structures has been formed in the organic planarizing layer 114. The pattern defines the electrically conductive interconnect linewidths and pitch. In one or more embodiments, the target linewidth is 2 to 80 nm.

In one or more embodiments of the invention, the organic planarizing layer 114 is patterned using a photolithography technique, such as optical lithography or direct write electron beam lithography or the like. For example, a photosensitive resist layer can be deposited onto the organic planarizing layer and lithographically patterned to expose selected portions of the organic planarizing layer. The photosensitive resist layer can be formed using conventional deposition techniques such chemical vapor deposition, plasma vapor deposition, sputtering, dip coating, spin-on coating, brushing, spraying and other like deposition techniques can be employed. Following formation of the photosensitive resist layer, the photosensitive resist layer is exposed to a desired pattern of radiation such as 193 nm, X-ray radiation, extreme ultraviolet (EUV) radiation, electron beam radiation or the like. Illustrative examples of 193 nm photosensitive resist layers include a methacrylate polymer, a phenolic based polymer or a copolymer thereof. Other types of organic photoresists such as, for example, polyesters can also be employed. Next, the exposed photosensitive resist layer is developed utilizing a conventional resist development process to expose selected portions of the organic planarizing layer 114 as shown, which can then be exposed to a wet or dry etchant to form the pattern.

Figure 2:
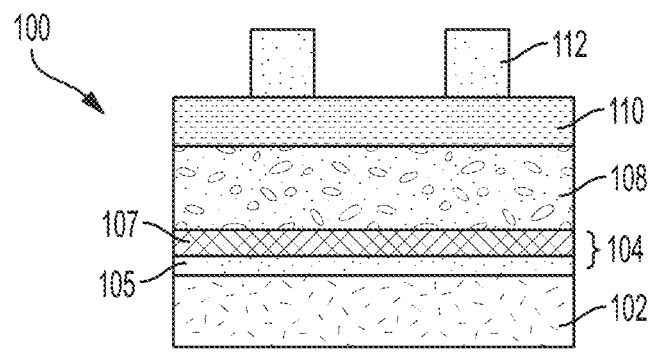
FIG. 2 depicts a cross sectional view of the portion of the exemplary integrated circuit of FIG. 1 subsequent to pattern transfer of the planarization layer to the hard mask layer in accordance with the present invention.

As illustrated in FIG. 2, the pattern in the organic planarizing layer 114 is transferred to the hard mask layer 112 using a dry etch process such as reactive ion etching or the like. Pattern transfer results in portions of the hard mask layer 112 being removed. By way of example, in the embodiment illustrated in FIG. 1, all portions of the hard mask layer 112 except for the portions residing directly beneath the planarizing layer 114 are removed down to the barrier layer 110. The pattern transfer also removes the remaining portions of the planarizing layer 114. This process results in a patterned mask layer 112.

Figure 3:
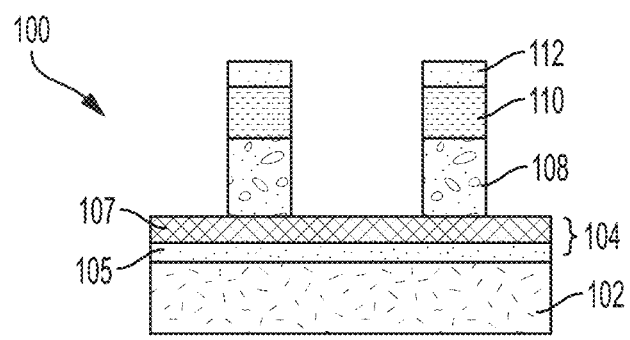
FIG. 3 depicts a cross sectional view of the portion of the exemplary integrated circuit of FIG. 2 subsequent to pattern transfer of the hardmask pattern to the barrier and copper layers in accordance with the present invention.

As illustrated in FIG. 3, the pattern in the hard mask layer 112 is transferred to the barrier layer 110 and the copper layer 108 using as a dry etch process such as reactive ion etching, for example. Pattern transfer results in portions of the barrier layer 110 and the copper layer 108 being removed. The portions of the barrier layer 110 and the copper layer 108 except for the portions residing directly beneath the patterned mask layer 112 are removed down to the liner layer 104. A portion of the hard mask layer 112 remains.

Figure 4:
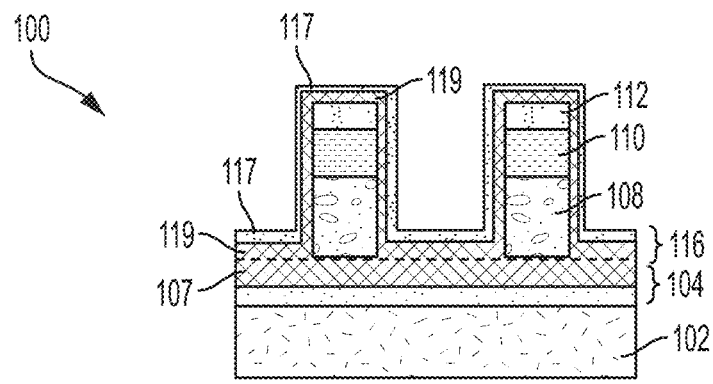
FIG. 4 depicts a cross sectional view of the portion of the exemplary integrated circuit of FIG. 3 subsequent to conformal deposition of a second liner layer onto the patterned structure in accordance with the present invention.

In FIG. 4, a second liner layer 116 is conformally deposited onto the patterned structure by a deposition process such as, for example, atomic layer deposition (ALD), chemical vapor deposition (CVD), plasma enhanced chemical vapor deposition (PECVD), sputtering, chemical solution deposition, successive ionic layer adsorption and reaction (SILAR), plating or the like. In one or more embodiments, the liner layer 116 includes Ta, Ti, Ru, Jr, Co, and/or W, and/or a metal nitride thereof such as TaN, TiN, and WN. In one or more embodiments, the second liner layer 116 can include a nitrogen gradient similar to the first liner layer 104 so as to form the corresponding nitride in a upper portion of the liner layer 116 and the pure metal in the lower portion. In this manner, the same material as the upper portion of the first liner 104 is deposited onto the first liner layer. As such, the top portion 117 of the second liner layer 116 is the corresponding nitride and the lower portion 119 is the metal, i.e., the same metal used to form the top portion of the first liner layer 104. In one or more embodiments of the invention, the second liner layer 116 can have a thickness greater than 1 nm to 15 nm, although greater or lesser thicknesses can be used.

The total thickness of the second liner layer 116 can range from 0.05 nm to 25 nm. In one or more other embodiments, the thickness of liner layer can range from 0.1 nm to 10 nm, and in still one or more other embodiments, the thickness of liner layer can range from 1 nm to 5 nm. The liner layer 24 serves as a barrier to prevent the copper conductive interconnect material 108 from diffusing through to the subsequently deposited dielectric layers 18 as well as prevent oxidation thereof. Advantageously, relative to a damascene process that includes deposition of the liner layer onto surfaces that can be formed of a dielectric material, the exposed surfaces of the structure 100 upon which the liner layer 116 is deposited are free of dielectric material, thereby providing effective adhesion.

Figure 5:
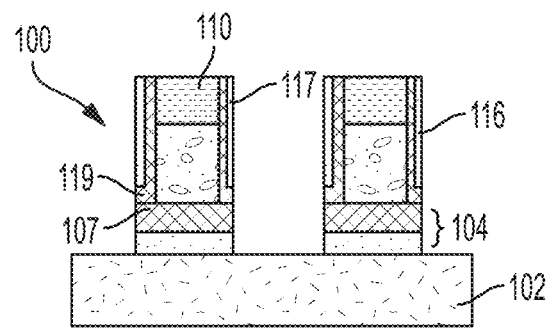
FIG. 5 depicts a cross sectional view of the portion of the exemplary integrated circuit of FIG. 4 subsequent to anisotropic etch to the dielectric layer in accordance with the present invention.

In FIG. 5, the second liner layer 116 is etched to the dielectric layer 102 using as a dry etch process such as reactive ion etching utilizing the barrier layer 110 as an etch stop. The resulting structure results in encapsulation of the copper layer 108 such that the liner layer 116 is directly disposed on sidewalls and bottom surface of the copper layer whereas the barrier layer is formed directly on the top surface of the copper layer.

Figure 6:
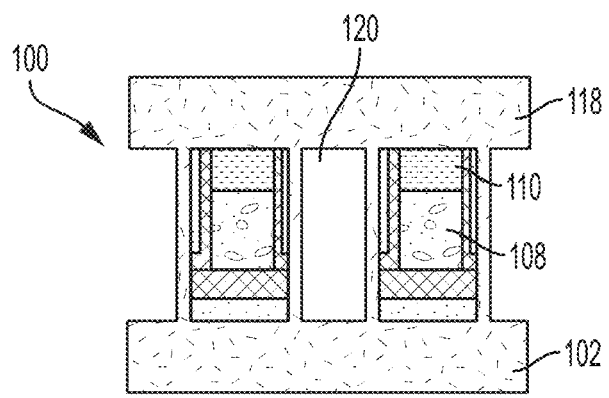
FIG. 6 depicts a cross sectional view of the portion of the exemplary integrated circuit of FIG. 5 subsequent to deposition of a second dielectric layer and formation of airgaps between lines in accordance with the present invention.

In FIG. 6, a dielectric layer 118 is deposited onto the patterned features and is configured to provide an airgap 120 adjacent the patterned conductive features. The dielectric can be a low k dielectric, wherein low k generally refers to a dielectric constant having a k-value of approximately 1.0 and 2.8. The dielectric layer can fill around the electrically conductive interconnect line as shown.

In one or more embodiments of the invention, the low-k dielectric layer 118 is formed of a material which is, or has as a precursor, a silicon-containing compound which contains silicon, carbon, oxygen and/or hydrogen atoms, e.g., materials selected from the group consisting of SiCOH, porous SiCOH, SiCH, and SiCNH. That is, in these embodiments, the low-k dielectric contains a silicon-containing compound, or the low-k dielectric is formed using a silicon-containing compound as a precursor material. Non-limiting examples of processes that can be used to form the low-k dielectric film include chemical vapor deposition (CVD), plasma enhanced chemical vapor deposition (PECVD), high density PECVD, photon assisted CVD, plasma-photon assisted CVD, cryogenic CVD, evaporation, chemical assisted vapor deposition, hot-filament CVD, CVD of a liquid polymer precursor, deposition from supercritical fluids, transport polymerization ("TP"), spin coating, dip coating, Langmuir-blodgett self-assembly, or like deposition methods.

In one or more embodiments of the invention, the low k dielectric material can be a silicon-containing compound (such as a material selected from the group consisting of SiCOH, porous SiCOH, SiCH, and SiCNH) and an oxidant. Suitable silicon-containing compounds are compounds for which plasma polymerization reactions are possible and include organo-silanes and organo-siloxanes. In one or more embodiments, the silicon-containing compound is a commonly available liquid phase silicon source. Examples include, but are not limited to, tetramethylcylcotetrasiloxane, octamethylcyclotetrasiloxane, tetraethylorthosilicate, tri-ethoxy silane (TES), TMS, MTEOS, TMOS, MTMOS, DMDMOS Diethoxy silane(DES), triphenylethoxysilane, 1-(triethoxysilyl)-2-(diethoxymethylsilyl)ethane, tri-t-butoxylsilanol, tetramethoxy silane, and. Particular examples include tetramethylsilane (4MS), tetraethoxysilane (TEOS) and octamethyltetrasiloxane (OMCTS). Examples of suitable oxidants include ozone, hydrogen peroxide, oxygen, water, and alcohols such as methanol, ethanol, isoproponal and the like.

The deposition of the low k dielectric material to form the dielectric layer 118 and the formation of airgaps 120 between adjacent patterned conductive copper materials, i.e., electrically conductive interconnect lines, are controlled by the critical dimension space. Large spaces, e.g., spaces greater than 100 nm, can be filled with the dielectric material to provide effective mechanical strength whereas small spaces, e.g., spaces smaller than 50 nm, are defined by an airgap to improve RC delay and reliability. The particular spaces to be filled or provided with an airgap are not intended to be limited and will generally depend on the deposition process and materials used. Advantageously, there is no sacrificial placeholder material that needs to be removed or extracted from beneath a solid or semi-permeable bridge layer as was previously done.

The following examples are given to further illustrate aspects of the present invention. Because these examples are given for illustrative purposes only, the invention embodied therein should not be limited thereto.

Example 1

Figure 7:
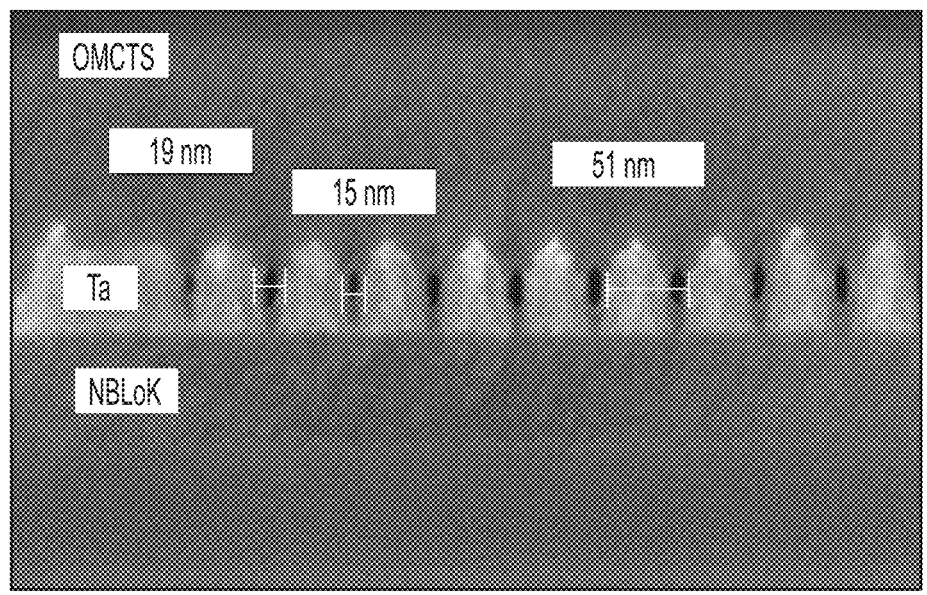
FIG. 7 is a micrograph illustrating formation of airgaps between lines having a spacing of about 15 nm and a pitch of 50 nm.

In this example, a blanket nBLoK layer was first deposited onto silicon wafers at a thickness of 80 nm by plasma enhanced chemical vapor deposition (PECVD). A metal layer at a thickness of about 50 nm was then deposited and subsequently patterned. A conformal layer of tantalum nitride at a thickness of about 5 nm was then deposited by atomic layer deposition onto the patterned metal layer to define a dense line and space pattern having line width of about 35 nm at a pitch of about 50 nm, i.e., the space was about 15 nm. A flowable polymerized film of octamethylcyclotetrasiloxane was then deposited using PECVD. FIG. 7 provides a cross-sectional micrograph of the line and space pattern depicting an airgap in the spaces adjacent the metal conductors.

Example 2

Figure 8:
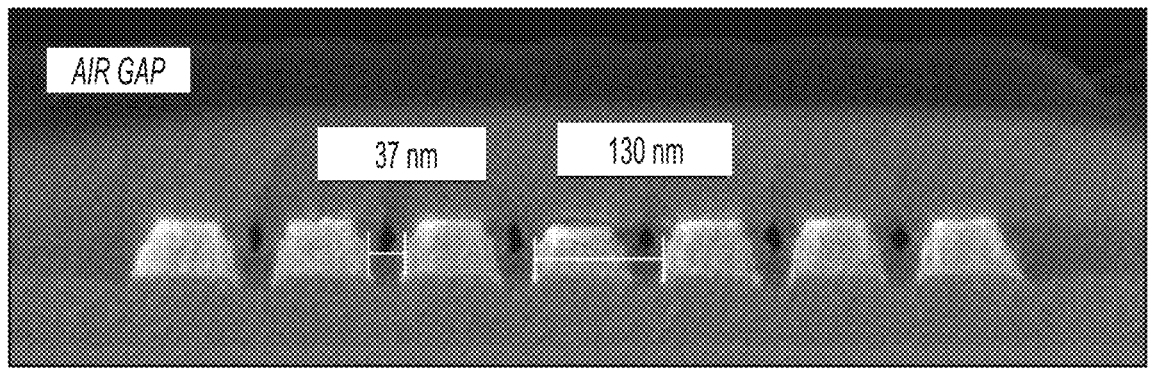
FIG. 8 is a micrograph illustrating dielectric fill in relatively small spaces between lines.
Figure 9:
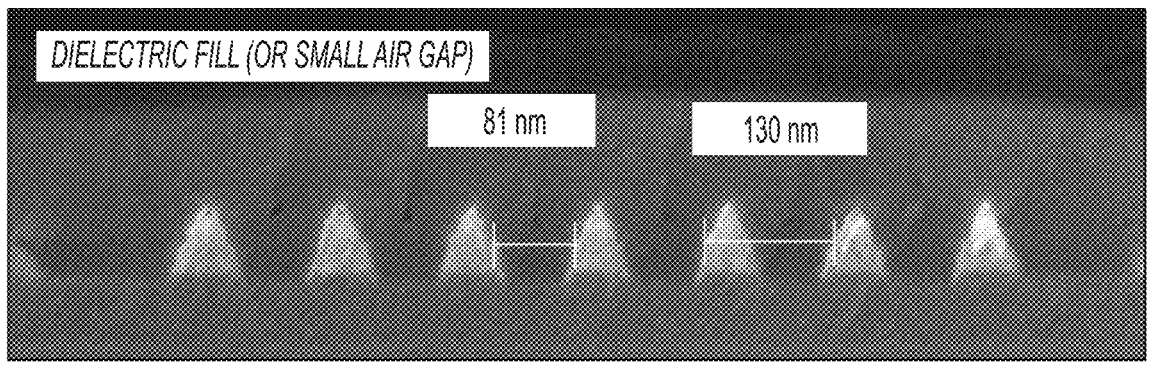
FIG. 9 is a micrograph illustrating dielectric fill in relatively large spaces between lines.

In this example, a blanket nBLoK layer was first deposited onto silicon wafers at a thickness of 80 nm by plasma enhanced chemical vapor deposition (PECVD). A metal layer at a thickness of about 50 nm was then deposited and subsequently patterned. A conformal layer of tantalum nitride at a thickness of about 5 nm was then deposited by atomic layer deposition onto the patterned metal layer to define a dense line and space pattern having line width of about 90 nm and 50 nm at a pitch of about 130 nm, i.e., the space was about 40 nm and 80 nm, respectively. FIGS. 8 and 9 provide cross-sectional micrographs of the respective line and space pattern depicting an air gap formed as a function of critical dimension space. For the smaller space of 40 nm, airgaps were formed in the spaces adjacent to the conductors as shown in FIG. 8 whereas the dielectric material filled the spaces in the entirety for the larger spaces of 80 nm as shown in FIG. 9.

Figure 10:
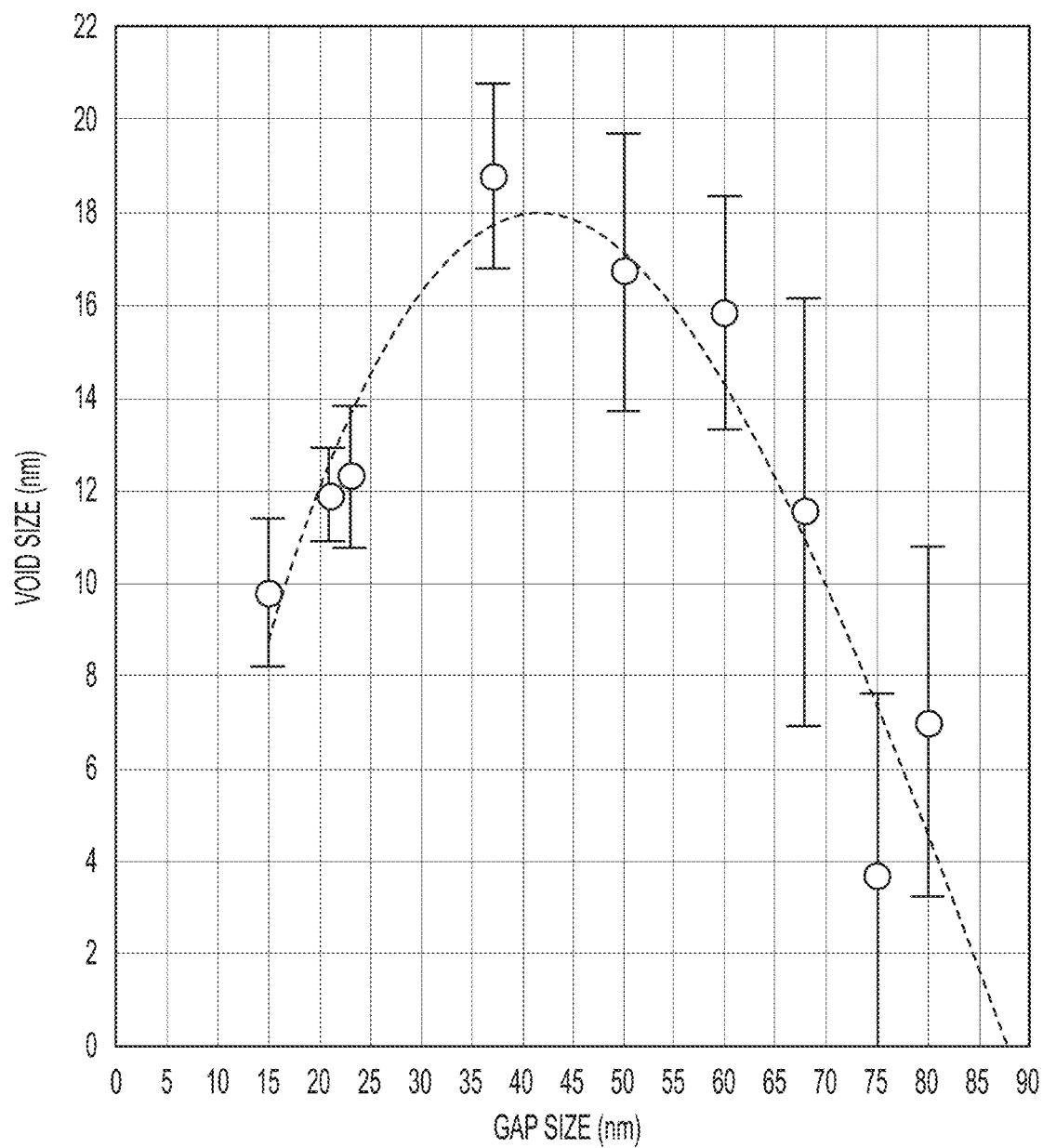
FIG. 10 graphically illustrates airgap size as a function of metal trench size.

In this example, airgap size as a function of metal trench size was measured for the interconnect structure as described in Example 1. The results are graphically shown in FIG. 10.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

It should be apparent that there can be many variations to this diagram or the steps (or operations) described herein without departing from the spirit of the invention. For instance, the steps can be performed in a differing order or steps can be added, deleted or modified. All of these variations are considered a part of the claimed invention.

While the preferred embodiment to the invention had been described, it will be understood that those skilled in the art, both now and in the future, can make various improvements and enhancements which fall within the scope of the claims which follow. These claims should be construed to maintain the proper protection for the invention first described.

What is claimed is:

1. An integrated circuit comprising:
   a surface of the integrated circuit;
   a plurality of electrically conductive interconnect lines, each of the plurality of electrically conductive interconnect lines comprising a metal cap, a copper conductor having an average grain size about equal to a thickness of the copper conductor, and a liner layer comprising a nitrogen gradient, wherein the metal cap is on an upper surface of the copper conductor, wherein the liner layer is on a bottom surface and sidewalls of the copper conductor, and on sidewalls of the metal cap, and wherein the liner layer and the metal cap collectively encapsulate the copper conductor; and
   a low k dielectric layer overlaying the plurality of electrically conductive interconnect lines and extending along sidewalls thereof, wherein the low k dielectric layer is configured to provide an airgap at spaces less than 90 nm on the surface between two adjacent electrically conductive interconnect lines among the plurality of interconnect lines, and wherein the low k dielectric layer comprises a silicon containing compound.

2. The integrated circuit of claim 1, wherein the metal cap comprises tantalum, titanium, ruthenium, iridium, cobalt, or tungsten.

3. The integrated circuit of claim 1, wherein each of the electrically conductive interconnect lines has a line width within a range of 2 nanometers to 80 nanometers.

4. The integrated circuit of claim 1, wherein the liner layer comprises at least one of tantalum, tantalum nitride, titanium, titanium nitride, cobalt, or ruthenium and the nitrogen gradient comprises a pure metal portion and a nitride portion.

5. The integrated circuit of claim 1, wherein the dielectric layer has a k-value in a range of 1.5 to 2.8.

6. The integrated circuit of claim 1, wherein the dielectric layer overlaying the at plurality of interconnect lines fills a spacing greater than 90 nm between two other adjacent interconnect lines among the plurality of interconnect lines.

7. The integrated circuit of claim 1, wherein the liner layer and the metal cap completely encapsulate the copper conductor.

8. An integrated circuit comprising:
   a surface of the integrated circuit;
   at least two electrically conductive interconnect lines separated by a spacing of less than 90 nm and formed on the surface, each of the at least two interconnect lines comprising a ruthenium cap, a copper conductor having an average grain size about equal to a thickness of the copper conductor, and a liner layer comprising a nitrogen gradient, wherein the ruthenium cap is on an upper surface of the copper conductor, wherein the liner layer is on a bottom surface and sidewalls of the copper conductor, and on sidewalls of the ruthenium cap, and wherein the liner layer and the ruthenium cap collectively encapsulate the copper conductor; and
   a silicon containing dielectric layer overlaying the at least two electrically conductive interconnect lines and extending along sidewalls thereof, wherein the dielectric layer is configured to provide an airgap between the at least two electrically conductive interconnect lines at the spacing.

9. The integrated circuit of claim 8, wherein the liner layer comprises at least one of tantalum, tantalum nitride, titanium, titanium nitride, cobalt, or ruthenium and the nitrogen gradient comprises a pure metal portion and a nitride portion.

10. The integrated circuit of claim 8, wherein the dielectric layer comprises a SiCOH, or a SiOCH dielectric having a k-value in a range of 1.5 to 2.8.

11. An integrated circuit comprising:
    a surface of the integrated circuit; and
    at least two electrically conductive interconnect lines separated by a space of less than 90 nm and at least two additional electrically conductive interconnect lines separated by a space greater than 90 nm formed on the surface, each of the at least two interconnect lines and the at least two additional interconnect lines comprising a ruthenium cap, a copper conductor having an average grain size about equal to a thickness of the copper conductor, and a liner layer comprising a nitrogen gradient, wherein the ruthenium cap is on an upper surface of each copper conductor, wherein the liner layer is on a bottom surface and sidewalls of each copper conductor, and on sidewalls of the ruthenium cap, and wherein the liner layer and the metal cap collectively encapsulate the copper conductor; and
    a silicon containing dielectric layer overlaying the at least two interconnect lines and the at least two additional interconnect lines and extending along sidewalls thereof, wherein the dielectric layer is configured to provide an airgap at the space of less than 90 nm and completely fill the spaces greater than 90 nm.

12. The integrated circuit of claim 11, wherein the dielectric layer comprises a SiCOH dielectric having a k-value in a range of 1.5 to 2.8.

* * * * *